(12) United States Patent
Hao et al.

(10) Patent No.: US 11,121,081 B2
(45) Date of Patent: Sep. 14, 2021

(54) ANTIFUSE ELEMENT

(71) Applicant: NANYA TECHNOLOGY CORPORATION, New Taipei (TW)

(72) Inventors: Chung-Peng Hao, New Taipei (TW); Chung-Lin Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/656,711

(22) Filed: Oct. 18, 2019

(65) Prior Publication Data
US 2021/0118797 A1  Apr. 22, 2021

(51) Int. Cl.
*H01L 23/525* (2006.01)

(52) U.S. Cl.
CPC .................. *H01L 23/5252* (2013.01)

(58) Field of Classification Search
CPC .................. H01L 23/5252; H01L 27/11206
See application file for complete search history.

(56) References Cited

U.S. PATENT DOCUMENTS

| | | | | |
|---|---|---|---|---|
| 3,783,428 A * | 1/1974 | Swain | ............... | H01H 85/303 337/148 |
| 5,955,751 A * | 9/1999 | Shroff | ............... | H01L 23/525 257/209 |
| 8,278,732 B1 * | 10/2012 | Ho | ............... | H01L 23/5252 257/530 |
| 2010/0230781 A1 * | 9/2010 | Booth, Jr. | ............ | H01L 23/5252 257/530 |
| 2015/0235945 A1 * | 8/2015 | Kirihata | ................ | H01L 21/743 257/530 |

FOREIGN PATENT DOCUMENTS

TW        201244049 A1   11/2012

* cited by examiner

*Primary Examiner* — Galina G Yushina
(74) *Attorney, Agent, or Firm* — Muncy, Geissler. Olds & Lowe, P.C.

(57) ABSTRACT

An antifuse element includes a conductive region formed in a semiconductor substrate extending in a first direction, a dielectric layer formed on a portion of the conductive region, a first conductive plug formed on the dielectric layer, a second conductive plug formed on another portion of the conductive region, a first conductive member formed over the first conductive plug, and a second conductive member formed over the second conductive plug. The dielectric layer has a first dielectric portion extending in a second direction, and a second dielectric portion extending in the first direction, in which the dielectric layer implements an electrical isolation between the conductive region and the first conductive plug. The first conductive plug has a first region of a first width and a second region of a second width, and the first width is greater than the second width.

18 Claims, 4 Drawing Sheets

ANTIFUSE ELEMENT

TECHNICAL FIELD

The present disclosure relates to integrated circuit technology, and more particularly, to electrically-programmable antifuse elements for integrated circuit devices.

DISCUSSION OF THE BACKGROUND

The semiconductor industry continues to improve the integration density of various electronic components (e.g., transistors, diodes, resistors, capacitors, etc.) by continual reductions in minimum feature size, which allow more components to be integrated into a given area. Integrated circuit (IC) devices are usually made with all internal connections set during the manufacturing process. However, due to high development costs, long manufacturing times, and high manufacturing tooling costs for forming such integrated circuits, users often desire circuits which can be configured or programmed in the field. Such circuits are called programmable circuits and usually contain programmable links. Programmable links are electrical interconnects which are either broken or created at selected electronic nodes by the user after the integrated circuit device has been fabricated and packaged in order to activate or deactivate respective selected electronic nodes.

A fuse element is one type of the programmable links. The programmable links in the IC devices are programmed by blowing the fuse element at selected cross-over points to create an open circuit. The combination of blown and unblown links represents a digital bit pattern of ones and zeros signifying data that the user wishes to store in the IC device. An antifuse element is another type of programmable link that has been developed for IC devices. In contrast to the programming mechanism causing an open circuit in the case with fuse elements, the programming mechanism in the antifuse element creates a short circuit or a relatively low resistance link therein.

However, antifuse structures may occupy a large footprint over semiconductor substrates, and a high current density and a high electric field may be needed. As the size and device densities of the integrated circuit are further decreased, antifuse elements with favorable size and breakdown conditions are required.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides an antifuse element, including a conductive region, a dielectric layer, a first conductive plug, a second conductive plug, a first conductive member, and a second conductive member. The first conductive region is formed in a semiconductor substrate, extending in a first direction. The dielectric layer is formed on a portion of the conductive region. The dielectric layer includes a first dielectric portion extending in a second direction perpendicular to the first direction, and a second dielectric portion extending in the first direction, in which the dielectric layer implements an electrical isolation between the conductive region and the first conductive plug. The first conductive plug is formed on the dielectric layer. The first conductive plug has a first region of a first width, and a second region of a second width, in which the first width is greater than the second width. The second conductive plug is formed on another portion of the conductive region. The first conductive member is formed over the first conductive plug, extending in the second direction. The second conductive member is formed over the second conductive plug, extending in the second direction.

In some embodiments, the antifuse element further includes a barrier layer disposed between the dielectric layer and the first conductive plug.

In some embodiments, the dielectric layer includes silicon oxide.

In some embodiments, the dielectric layer has a thickness of about 1 to 5 nm.

In some embodiments, the first conductive plug and the second conductive plug include tungsten, copper, or doped polysilicon.

In some embodiments, the first conductive member and the second conductive member include tungsten, copper, or aluminum.

In some embodiments, the antifuse element further includes a plurality of isolation structures formed in the semiconductor substrate for defining the conductive region therein.

In some embodiments, the isolation structures are shallow trench isolation (STI) structures.

In some embodiments, the first conductive member overlaps the conductive region, having a first overlapping area therebetween, and the dielectric layer and the conductive region have a second overlapping area therebetween, wherein a ratio of an area of the first overlapping area to an area of the second overlapping area is about 1.5:1 to 2.5:1.

In some embodiments, the first dielectric portion of the dielectric layer has a surface area greater than an area of the first region or the second region of the first conductive plug over the semiconductor substrate, and the first region of the first conductive plug has a surface area greater than the area of the second region of the first conductive plug over the semiconductor substrate.

Another aspect of the present disclosure provides an antifuse element, including a conductive region, a dielectric layer, a first conductive plug, a second conductive plug, a first conductive member, and a second conductive member. The first conductive region is formed in a semiconductor substrate, extending in a first direction. The dielectric layer is formed on a portion of the conductive region. The dielectric layer has a first dielectric portion extending in a second direction perpendicular to the first direction, and a second dielectric portion extending in the first direction, in which the dielectric layer implements an electrical isolation between the conductive region and the first conductive plug. The first conductive plug is formed on the dielectric layer. The second conductive plug is formed on another portion of the conductive region. The first conductive member is formed over the first conductive plug, extending in the second direction. The second conductive member is formed over the second conductive plug, extending in the second direction.

In some embodiments, the antifuse element further includes a barrier layer disposed between the dielectric layer and the first conductive plug.

In some embodiments, the dielectric layer includes silicon oxide.

In some embodiments, the dielectric layer has a thickness of about 1 to 5 nm.

In some embodiments, the first conductive plug and the second conductive plug include tungsten, copper, or doped polysilicon.

In some embodiments, the first conductive member and the second conductive member include tungsten, copper, or aluminum.

In some embodiments, the antifuse element further includes a plurality of isolation structures formed in the semiconductor substrate for defining the conductive region therein.

In some embodiments, the isolation structures are shallow trench isolation (STI) structures.

In some embodiments, the first conductive member overlaps the conductive region, having a first overlapping area therebetween, and the dielectric layer and the conductive region have a second overlapping area therebetween, and a ratio of an area of the first overlapping area to an area of the second overlapping area is about 1.5:1 to 2.5:1.

In some embodiments, the first dielectric portion of the dielectric layer has a surface area greater than an area of the first conductive plug over the semiconductor substrate.

Due to the structure of the conductive plugs and the dielectric layers, the antifuse elements of the present disclosure enhance electric fields that accelerate dielectric breakdown, thereby improving the performance of systems employing the antifuse elements. Due to the ease and predictability of the dielectric breakdown in the antifuse elements, simpler circuitry may be used to provide the programming voltage on-chip.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to electrically-programmable antifuse elements. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure are described in detail below. However, in addition to the detailed description, the present disclosure may also be widely implemented in other embodiments. The scope of the present disclosure is not limited to the detailed description, but is defined by the claims.

Figure 1:
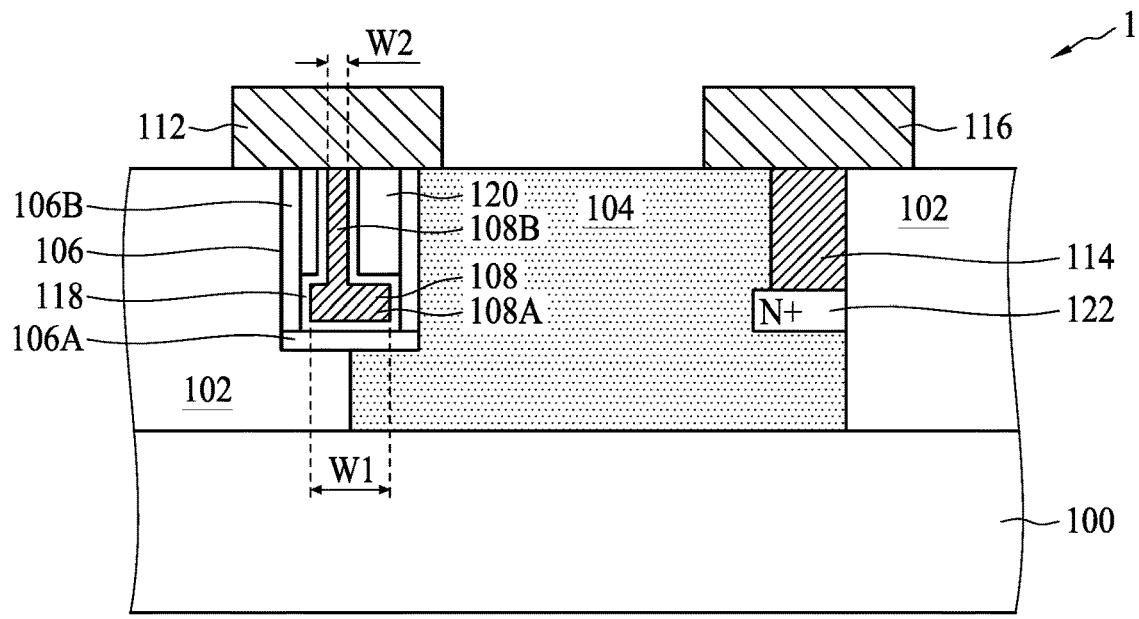
FIG. 1 is a cross-sectional view depicting an antifuse element for an integrated circuit (IC) device along a line 1-1 of FIG. 2 in accordance with some embodiments of the present disclosure.
Figure 2:
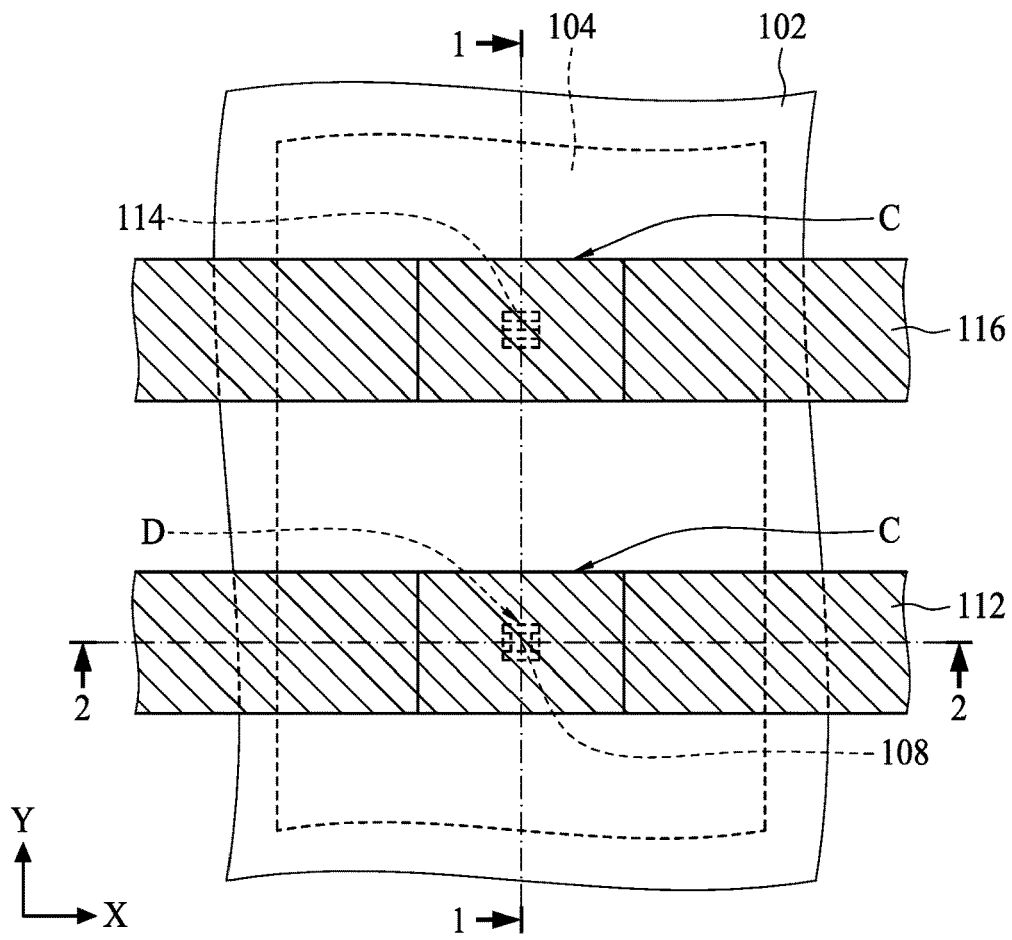
FIG. 2 is a top view of the antifuse element of FIG. 1 in accordance with some embodiments of the present disclosure.

In accordance with some embodiments of the disclosure, FIG. 1 is a cross-sectional view depicting an antifuse element for an integrated circuit (IC) device, and FIG. 2 is a top view of the antifuse element of FIG. 1. The cross-sectional view of FIG. 1 is taken along a line 1-1 of FIG. 2. With reference to FIG. 1 and FIG. 2, an antifuse element 1 includes a semiconductor substrate 100, a conductive region 104 formed in a portion of the semiconductor substrate 100 and extending in a first direction, a doped region 122 formed in the conductive region 104, a dielectric layer 106 formed on a portion of the conductive region 104, a first conductive plug 108 formed to have its bottom and side surfaces to be surrounded by the dielectric layer 106, a second conductive plug 114 formed on another portion of the conductive region 104, a buried dielectric region 120, and a first conductive member 112 and a second conductive member 116 respectively covering the first conductive plug 108 and the second conductive plug 114. The first direction may be the direction Y shown in FIG. 2, for example.

Figure 3:
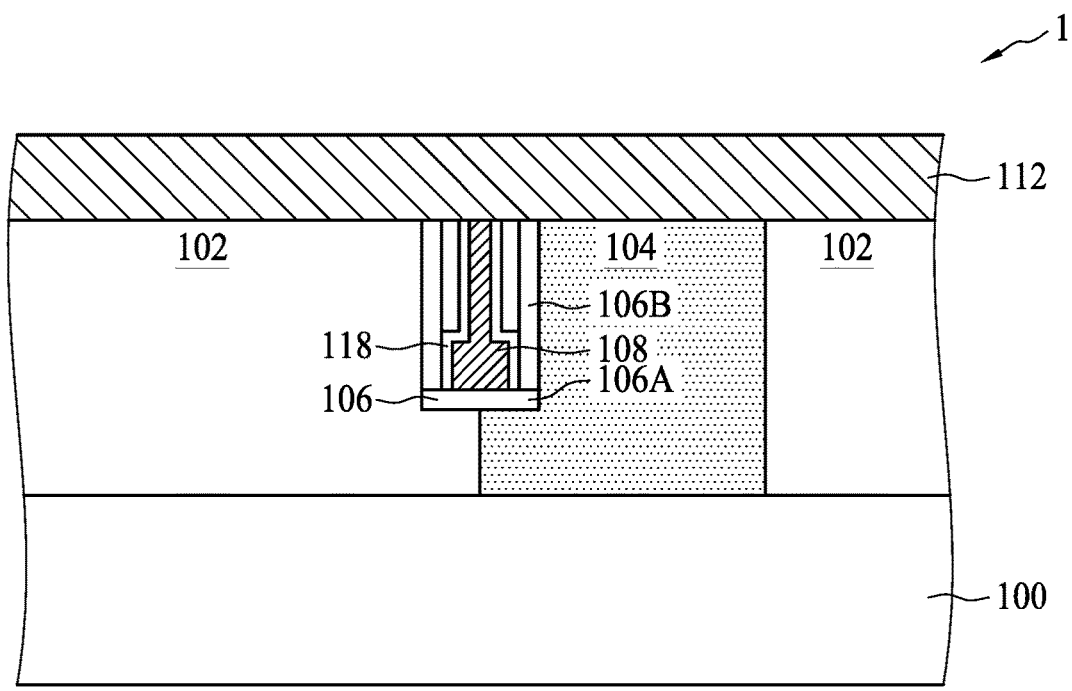
FIG. 3 is a cross-sectional view depicting the antifuse element of FIG. 1 along a line 2-2 of FIG. 2 in accordance with some embodiments of the present disclosure.

In some embodiments, the semiconductor substrate 100 may be, for example, a silicon substrate having a first conductivity such as P-type conductivity. As shown in FIG. 2 and FIG. 3, a plurality of isolation structures 102 such as shallow trench isolation (STI) structures may be formed in the semiconductor substrate 100, thereby defining the conductive region 104. The conductive region 104 may be, for example, a region with a second conductivity different from the first conductivity of the semiconductor substrate 100, such as an N-type doped region with doping concentration of about 1E17 to 1E19 atoms/cm². In some embodiments, the conductive region 104 may serve as an active area for devices or antifuses of an integrated circuit.

In some embodiments, the first conductive plug 108 and the second conductive plug 114 are formed over various portions of the conductive region 104 and are electrically isolated from each other by a plurality of isolation structures 102. The dielectric layer 106 and the conductive plug 108 depicted in FIG. 2 may be formed during formation of, for example, a gate oxide and a gate electrode of a gate structure, and the isolation structures 102 may be sequentially formed to isolate the dielectric layer 106 and the first conductive plug 108. In some embodiments, the antifuse element 1 further includes a barrier layer 118 disposed between the dielectric layer 106 and the first conductive plug 108. The barrier layer 118 may include combinations of titanium (Ti), titanium nitride (TiN), tantalum (Ta), tantalum nitride (TaN), or combinations of other suitable materials, according to some embodiments of the present disclosure.

As shown in FIG. 1, in some embodiments, the dielectric layer 106 is formed on a portion of the conductive region 104, and the dielectric layer 106 includes a first dielectric portion 106A extending in a second direction perpendicular to the first direction and a second dielectric portion 106B extending toward a direction away from the semiconductor substrate 100 and perpendicular to the first and second directions. As shown in FIG. 2, the first direction may be the Y direction, and the second direction may be the X direction. In some embodiments, the dielectric layer 106 implements an electrical isolation between the conductive region 104 and the first conductive plug 108. Moreover, the dielectric layer 106 may include nitrided silicon oxide and may have a thickness of about 1 to 5 nm. It should be noted, however, that in some embodiments, the first dielectric portion 106A and the second dielectric portion 106B may have the same thickness, the first dielectric portion 106A may have a thickness greater than that of the second dielectric portion 106B, or the second dielectric portion 106B may have a thickness greater than that of the first dielectric portion 106A.

In some embodiments, the first conductive plug 108 may include a first region 108A with a first width W1 and a second region 108B with a second width W2, in which the first width W1 is greater than the second width W2. The first width W1 may be about 25 to 50 nm, and the second width W2 may be about 5 to 15 nm, for example. The second conductive plug 114 shown in FIG. 2 may be formed during the formation of, for example, a conductive contact, and may also be formed after the formation of the isolation structures 102. In some embodiments, the second conductive plug 114 may be formed on the doped region 122, so as to form a low resistance ohmic contact. The first conductive plug 108 and the second conductive plug 114 may include tungsten, copper, doped polysilicon, other suitable materials, or alloys thereof. The first conductive plug 108 and the second conductive plug 114 may have a thickness of about 50 to 200 nm, for example. In some embodiments, the first dielectric portion 106A of the dielectric layer 106 has a surface area greater than areas of the first region 108A and the second region 108B of the first conductive plug 108 over the semiconductor substrate 100, and the first region 108A of the first conductive plug 108 has a surface area greater than the area of the second region 108B of the first conductive plug 108 over the semiconductor substrate 100.

In some embodiments, the isolation structures 102 may include silicon nitride, and the isolation structures 102 may also include layers made of BSG, PSG or BPSG (not shown). The first conductive member 112 and the second conductive member 116 formed on the conductive region 104 may be, for example, the lowest conductive lines having a thickness of about 10 to 50 nm and may include tungsten, copper, aluminum, other suitable materials, or alloys thereof. In some embodiments, the buried dielectric region 120 may include silicon nitride, for example. The buried dielectric region 120 may be formed after the fabrication of the first conductive plug 108 according to some embodiments of the disclosure.

With reference to FIG. 2, which is a top view of the antifuse element shown in FIG. 1, the conductive region 104 is formed in a strip-like configuration extending over the semiconductor substrate 100 in the first direction, such as the direction Y shown in FIG. 2. The first and second conductive members 112 and 116 are formed in strip-like configurations extending over the conductive region 104 in the second direction, such as the direction X shown in FIG. 2. Accordingly, the first and second conductive members 112 and 116 respectively intersect the conductive region 104, thereby forming an overlapping region C therebetween. Moreover, the first conductive plug 108 is formed over a portion of the conductive region 104 and the dielectric layer 106 is formed between the first conductive plug 108 and the conductive region 104 such that an overlapping region D is formed between the dielectric layer 106 and the conductive region 104. In some embodiments, a ratio of an area of the overlapping region C to an area of the overlapping area D is about 1.5:1 to 2.5:1 to optimize programming of the antifuse element 1 as shown in FIG. 1.

According to some embodiments of the present disclosure, FIG. 3 is a cross-sectional view depicting the antifuse element of FIG. 1 along a line 2-2 of FIG. 2. With reference to FIG. 3, in the cross-sectional view along the line 2-2, the first conductive plug 108, the dielectric layer 106, and the barrier layer 118 formed over the semiconductor substrate 100 are shown. Moreover, the first conductive plug 108 and the dielectric layer 106 are formed over the conductive region 104 defined in the semiconductor substrate 100 by two adjacent isolation structures 102, which may be shallow trench isolation (STI) structures, for example.

Figure 4:
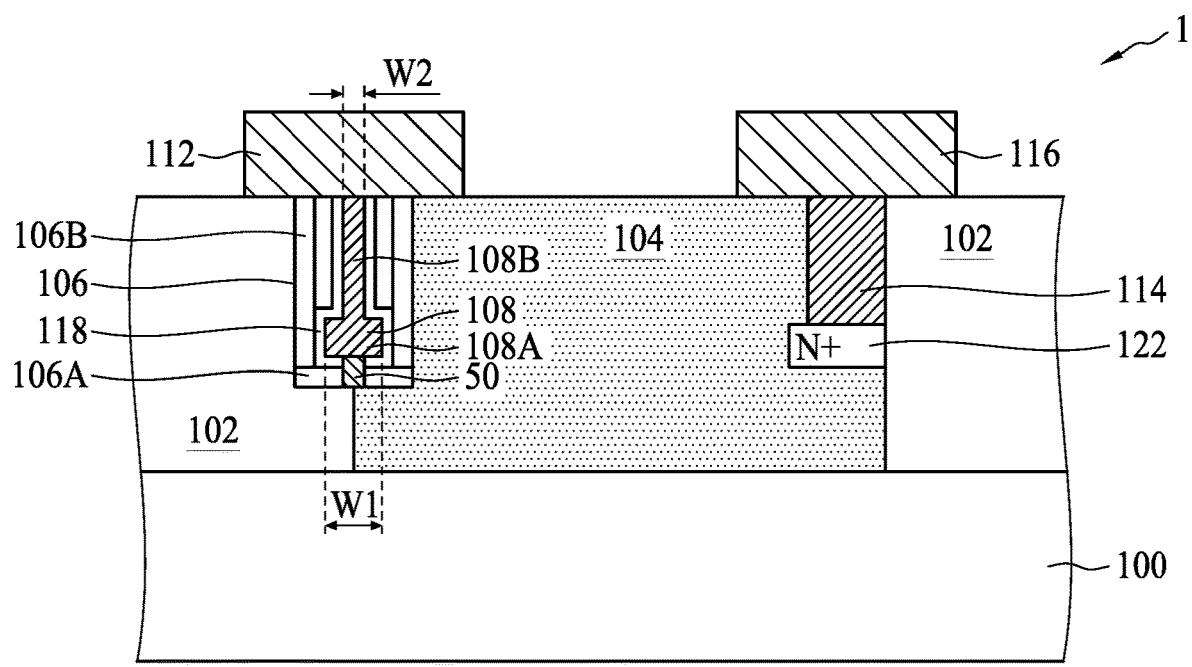
FIG. 4 is a cross-sectional view depicting the antifuse element of FIG. 1 after programming thereof, in accordance with some embodiments of the present disclosure.

FIG. 4 is a cross-sectional view depicting the antifuse element shown in FIG. 1 after programming of the antifuse element, in accordance with some embodiments of the present disclosure. During programming (not shown) of the antifuse element 1 of FIG. 1, a programming voltage in a range of 4 to 6 volts is provided to the first conductive member 112 formed over the first conductive plug 108, and the second conductive member 116 formed over the second conductive plug 114 is grounded or held at the substrate potential. Accordingly, one or more conductive filaments 50 may be formed in the dielectric layer 106 by electromigration of the materials of the first conductive plug 108 into the dielectric layer 106, and an open circuit in the integrated circuit device may thereby be changed into a short circuit. The first conductive member 112 formed over the first conductive plug 108 may thus electrically connect to the conductive region 104 via the first conductive plug 108 and the conductive filaments 50 formed in the dielectric layer 106, and a digital bit pattern of ones and zeros signifying data which a user wishes to store in the IC device is accordingly changed. Moreover, due to the structure of the first conductive plug 108 and the dielectric layer 106, the antifuse element 1 of the present disclosure enhances electric fields that accelerate dielectric breakdown of the dielectric layer 106.

Figure 5:
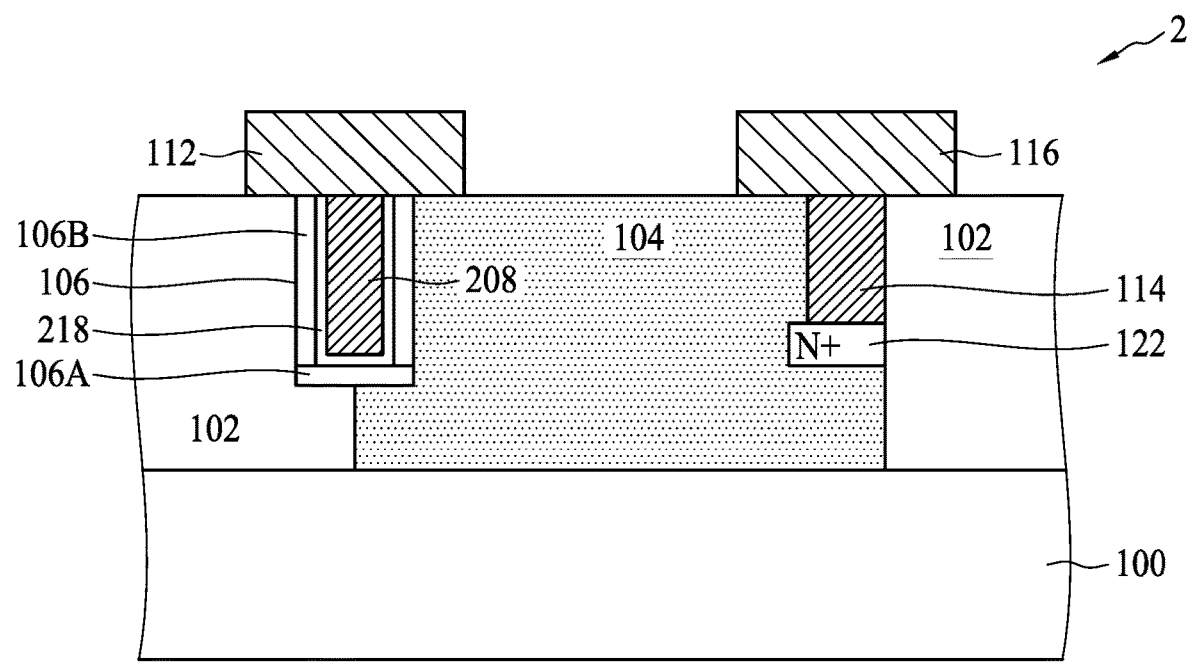
FIG. 5 is a cross-sectional view depicting an antifuse element for an IC device in accordance with some embodiments of the present disclosure.
Figure 6:
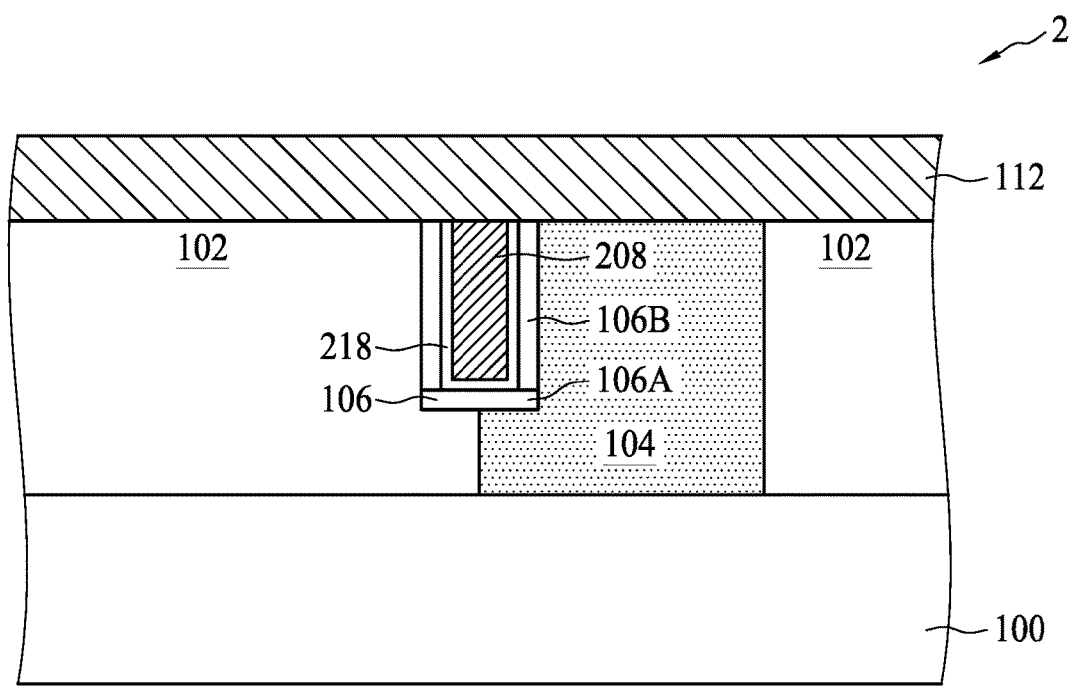
FIG. 6 is another cross-sectional view depicting the antifuse element of FIG. 5 in accordance with some embodiments of the present disclosure.

It should be noted that the structure of the antifuse element in some embodiments of the present disclosure may be adjusted to fit the applications employing the antifuse element. FIG. 5 and FIG. 6 are cross-sectional views depicting another antifuse element for an IC device, in accordance with some embodiments of the present disclosure. An antifuse element 2 of FIG. 5 and FIG. 6 has a modified structure compared to the antifuse element 1, and description of similar components will not be repeated hereinafter. The cross-sectional view of FIG. 5 is taken along the line 1-1 of FIG. 2, and the cross-sectional view of FIG. 6 is taken along the line 2-2 of FIG. 2. With reference to FIG. 5 and FIG. 6, a third conductive plug 208 of the antifuse element 2 has a structure different from that of the first conductive plug 108 of the antifuse element 1. The third conductive plug 208 has a uniform width, whereas the first conductive plug 108 has two regions of different widths. The different structure of the third conductive plug 208 presents different dielectric breakdown characteristics for the dielectric layer 106 of the antifuse element 2, which may be useful for certain applications.

In some embodiments, the third conductive plug 208 and the second conductive plug 114 are formed over various portions of the conductive region 104 and are electrically isolated from each other by the isolation structures 102. The dielectric layer 106 and the third conductive plug 208 depicted in FIG. 5 and FIG. 6 may be formed during formation of, for example, a gate oxide and a gate electrode of a gate structure, and the isolation structures 102 may be sequentially formed to isolate the dielectric layer 106 and the third conductive plug 208. In some embodiments, the antifuse element 2 further includes a barrier layer 218 disposed between the dielectric layer 106 and the third conductive plug 208. The barrier layer 218 may include combinations of titanium (Ti), titanium nitride (TiN), tantalum (Ta), tantalum nitride (TaN), or combinations of other suitable materials, according to some embodiments of the present disclosure.

In some embodiments, the third conductive plug 208 may have a width of about 25 to 50 nm, and the third conductive plug 208 may include tungsten, copper, doped polysilicon, other suitable materials, or alloys thereof. The third conductive plug 208 may have a thickness of about 50 to 200 nm, for example. In some embodiments, a ratio of an area of the overlapping region C to an area of the overlapping area D (defined earlier in the description of FIG. 2) of the antifuse element 2 is about 1.5:1 to 2.5:1 to optimize programming of the antifuse element 2. Moreover, in some embodiments, the first dielectric portion 106A of the dielectric layer 106 has a surface area greater than that of the third conductive plug 208 over the semiconductor substrate 100.

Figure 7:
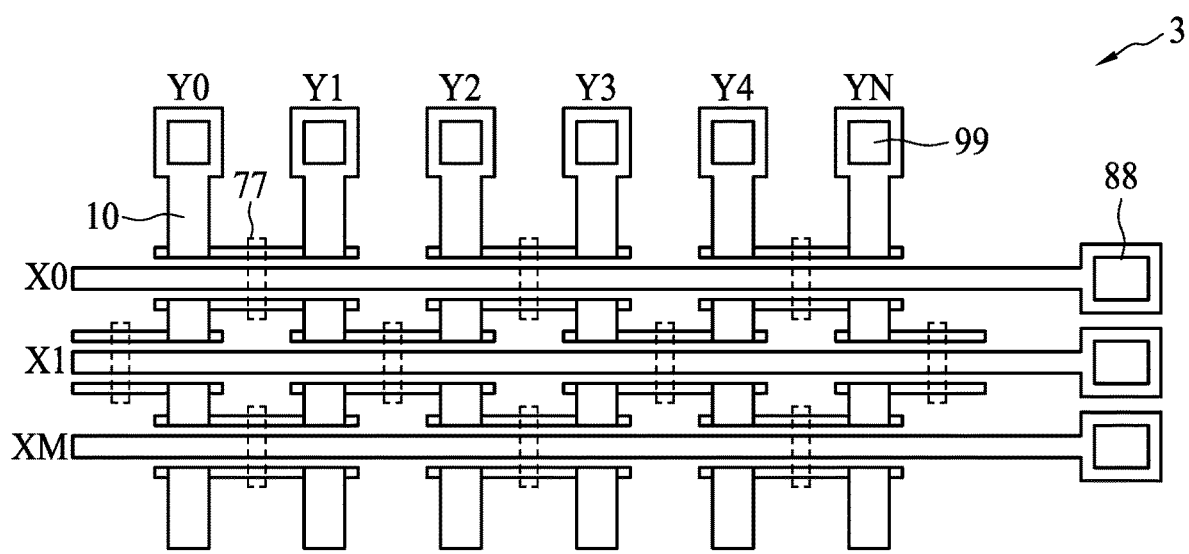
FIG. 7 is a schematic layout diagram of a plurality of antifuse elements in an array configuration in accordance with some embodiments of the present disclosure.

FIG. 7 is a schematic layout diagram of a plurality of antifuse elements in an array configuration in accordance with some embodiments of the present disclosure. With reference to FIG. 7, an array 3 includes a plurality of antifuse elements 10, which may be implemented by the antifuse elements as described by embodiments of the present disclosure. In some embodiments, the array 3 may include a plurality of active areas, doped junctions, buried gates, and STI regions shared by the antifuse elements 10. The array 3 may include a plurality of lines X0-XM and lines Y0-YN. In some embodiments, the lines X0-XM may connect the contacts 77 to doped junctions in the active areas, and the lines Y0-YN may connect the contacts 99 to buried gates of the antifuse elements 10. In some embodiments, the contacts 77 may be centered in the active areas, for example. Moreover, the lines X0-XM may be extended and connected to the contacts 88, and the contacts 88 and 99 may be disposed in STI regions.

In some embodiments, the array 3 may be implemented as a memory array, in which lines X0-XM may be bitlines, and lines Y0-YN may be wordlines. The antifuse elements 10 may be programmed by rupturing the gate oxide, which may be accomplished by applying a sufficient voltage differential between the gate and the channel of the cells to be programmed, as well as applying a much lower voltage differential to other cells. Sense amplifier circuits known in the art may be used to sense the logic states of the array 3.

Figure 8:
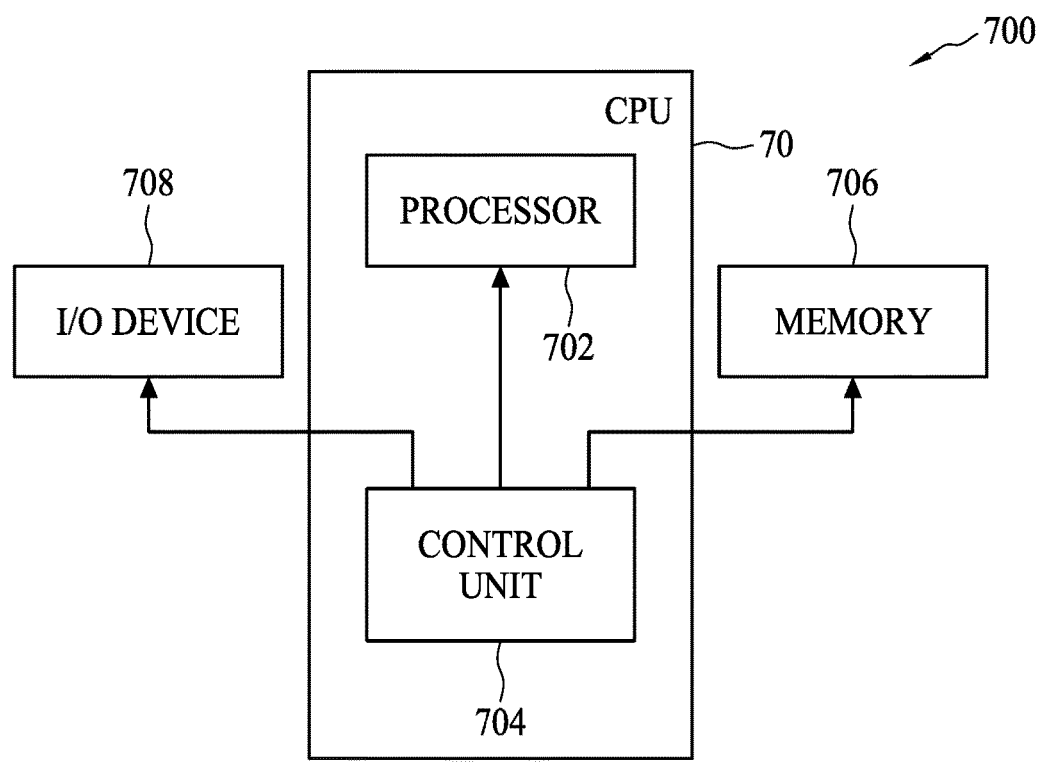
FIG. 8 is a block diagram of an electronic system in accordance with some embodiments of the present disclosure.

FIG. 8 is a block diagram of an electronic system according to the some embodiments of the present disclosure. With reference to FIG. 8, an electronic system 700 has functional elements, including a central processing unit (CPU) 70, a memory device 706, and input/output (I/O) devices 708. The CPU 70 may include a processor or arithmetic/logic unit (ALU) 702 and a control unit 704. In some embodiments, the electronic system 700 may have a native set of instructions that specify operations to be performed on data by the processor 702 and other interactions between the processor 702, the memory device 706, and the I/O devices 708. The control unit 704 coordinates all operations of the processor 702, the memory device 706, and the I/O devices 708 by continuously cycling through a set of operations that cause instructions to be fetched from the memory device 706 and executed. In some embodiments, the processor 702 and the control unit 704, for example, are formed as or include Field Programmable Gate Arrays (FPGAs) or Alterable Logic Devices (ALDs), which include scalable high performance antifuse elements of the present disclosure. Moreover, the memory device 706 may also include the antifuse elements of the present disclosure. Due to the structure of the conductive plugs and the dielectric layers, the antifuse elements of the present disclosure enhance electric fields that accelerate dielectric breakdown, thereby improving the performance of the entire electronic system. The antifuse elements of the present disclosure may also be arranged in an array and used in memory devices to repair defective bit cells, for instance. Moreover, because of the ease and predictability of the dielectric breakdown in the antifuse elements, simpler circuitry may be used to provide the programming voltage on-chip.

One aspect of the present disclosure provides an antifuse element, including a conductive region, a dielectric layer, a first conductive plug, a second conductive plug, a first conductive member, and a second conductive member. The first conductive region is formed in a semiconductor substrate, and extends in a first direction. The dielectric layer is formed on a portion of the conductive region. The dielectric layer has a first dielectric portion extending in a second direction perpendicular to the first direction, and a second dielectric portion extending in the first direction, in which the dielectric layer implements an electrical isolation between the conductive region and the first conductive plug. The first conductive plug is formed on the dielectric layer. The first conductive plug has a first region of a first width, and a second region of a second width, in which the first width is greater than the second width. The second conductive plug is formed on another portion of the conductive region. The first conductive member is formed over the first conductive plug, and extends in the second direction. The second conductive member is formed over the second conductive plug, and extends in the second direction.

Another aspect of the present disclosure provides an antifuse element, including a conductive region, a dielectric layer, a first conductive plug, a second conductive plug, a first conductive member, and a second conductive member. The first conductive region is formed in a semiconductor substrate, and extends in a first direction. The dielectric layer is formed on a portion of the conductive region. The dielectric layer has a first dielectric portion extending in a second direction perpendicular to the first direction, and a second dielectric portion extending in the first direction, in which the dielectric layer implements an electrical isolation between the conductive region and the first conductive plug. The first conductive plug is formed on the dielectric layer. The second conductive plug is formed on another portion of the conductive region. The first conductive member is formed over the first conductive plug, and extends in the second direction. The second conductive member is formed over the second conductive plug, and extends in the second direction.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. An antifuse element, comprising:
   a conductive region formed in a semiconductor substrate, extending in a first direction;
   a plurality of isolation structures formed in the semiconductor substrate for defining the conductive region therein;
   a dielectric layer formed on a portion of the conductive region, the dielectric layer having a first dielectric portion extending in a second direction perpendicular to the first direction, and a second dielectric portion extending in a third direction, perpendicular to the first and second directions, wherein the second dielectric portion is formed over bottom portions of the conductive region and at least one of the plurality of isolation structures, and has its top surface leveled with a top surface of the conductive region;
   a first conductive plug formed to have its bottom and side surfaces to be surrounded by the dielectric layer, the first conductive plug having a first region of a first width, and a second region of a second width, wherein the first width is greater than the second width, wherein a portion of the first conductive plug is formed over the bottom portions of the conductive region and at least one of the plurality of isolation structures;
   a second conductive plug formed on another portion of the conductive region;
   a first conductive member formed over the first conductive plug, extending in the second direction; and
   a second conductive member formed over the second conductive plug, extending in the second direction;
   wherein the dielectric layer implements an electrical isolation between the conductive region and the first conductive plug.

2. The antifuse element of claim 1, further comprising a barrier layer disposed between the dielectric layer and the first conductive plug.

3. The antifuse element of claim 1, wherein the dielectric layer comprises silicon oxide.

4. The antifuse element of claim 1, wherein the dielectric layer has a thickness of about 1 to 5 nm.

5. The antifuse element of claim 1, wherein the first conductive plug and the second conductive plug comprise tungsten, copper, or doped polysilicon.

6. The antifuse element of claim 1, wherein the first conductive member and the second conductive member comprise tungsten, copper, or aluminum.

7. The antifuse element of claim 1, wherein the isolation structures are shallow trench isolation (STI) structures.

8. The antifuse element of claim 1, wherein the first conductive member overlaps the conductive region, having a first overlapping area therebetween, and the dielectric layer and the conductive region have a second overlapping area therebetween, and a ratio of an area of the first overlapping area to an area of the second overlapping area is about 1.5:1 to 2.5:1.

9. The antifuse element of claim 1, wherein the first dielectric portion of the dielectric layer has a surface area greater than an area of the first region or an area of the second region of the first conductive plug over the semiconductor substrate, and the first region of the first conductive plug has a surface area greater than the area of the second region of the first conductive plug over the semiconductor substrate.

10. An antifuse element, comprising:
    a conductive region formed in a semiconductor substrate, extending in a first direction;
    a plurality of isolation structures formed in the semiconductor substrate for defining the conductive region therein;
    a dielectric layer formed on a portion of the conductive region, the dielectric layer having a first dielectric portion extending in a second direction perpendicular to the first direction, and a second dielectric portion extending in a third direction, perpendicular to the first and second directions, wherein the second dielectric portion is formed over the conductive region and at least one of the plurality of isolation structures;
    a first conductive plug formed to have its bottom and side surfaces to be surrounded by the dielectric layer, wherein a portion of the first conductive plug is formed over lower parts of the conductive region and at least one of the plurality of isolation structures, and a top surface of the first conductive plug is leveled with a top surface of the conductive region;
    a second conductive plug formed on another portion of the conductive region;
    a first conductive member formed over the first conductive plug, extending in the second direction; and a second conductive member formed over the second conductive plug, extending in the second direction;

wherein the dielectric layer implements an electrical isolation between the conductive region and the first conductive plug.

11. The antifuse element of claim 10, further comprising a barrier layer disposed between the dielectric layer and the first conductive plug.

12. The antifuse element of claim 10, wherein the dielectric layer comprises silicon oxide.

13. The antifuse element of claim 10, wherein the dielectric layer has a thickness of about 1 to 5 nm.

14. The antifuse element of claim 10, wherein the first conductive plug and the second conductive plug comprise tungsten, copper, or doped polysilicon.

15. The antifuse element of claim 10, wherein the first conductive member and the second conductive member comprise tungsten, copper, or aluminum.

16. The antifuse element of claim 10, wherein the isolation structures are shallow trench isolation (STI) structures.

17. The antifuse element of claim 10, wherein the first conductive member overlaps the conductive region, forming a first overlapping area therebetween, and the dielectric layer and the conductive region form a second overlapping area therebetween, and a ratio of an area of the first overlapping area to an area of the second overlapping area is about 1.5:1 to 2.5:1.

18. The antifuse element of claim 10, wherein the first dielectric portion of the dielectric layer has a surface area greater than that of the first conductive plug over the semiconductor substrate.

* * * * *